United States Patent [19]

Andres et al.

[11] Patent Number: 4,900,925
[45] Date of Patent: Feb. 13, 1990

[54] ACCELERATION SENSOR PICK-UP WITH MAGNETIC BASE STABILIZATION

[75] Inventors: Rudolf Andres, Sindelfingen; Heinz W. Knoll, Stuttgart; Volker Petri, Aidlingen; Harald Pfistner, Stuttgart, all of Fed. Rep. of Germany

[73] Assignee: Daimler-Benz Aktiengesellschaft, Stuttgart, Fed. Rep. of Germany

[21] Appl. No.: 228,106

[22] Filed: Aug. 4, 1988

[30] Foreign Application Priority Data

Aug. 4, 1987 [DE] Fed. Rep. of Germany ....... 3725758

[51] Int. Cl.$^4$ .............................................. G01D 5/34
[52] U.S. Cl. ............................. 250/231 R; 73/517 R
[58] Field of Search ................. 250/231 R; 73/517 R, 73/517 B, 517 A, 538

[56] References Cited

U.S. PATENT DOCUMENTS 3,798,454  3/1974  Weiss ................................ 73/517 R
4,737,630  4/1988  Andersson ...................... 250/231 R

FOREIGN PATENT DOCUMENTS 3313033  8/1984  Fed. Rep. of Germany .
3402387  7/1985  Fed. Rep. of Germany .
3540948  5/1987  Fed. Rep. of Germany .
8504627  10/1985  PCT Int'l Appl. .

Primary Examiner—David C. Nelms
Attorney, Agent, or Firm—Barnes & Thornburg

[57] ABSTRACT

An omnidirectional optoelectronic acceleration pick-up for the automatic actuation of passenger safety devices in motor vehicles during emergency conditions, utilizes an inertial body which is held in its rest position by an annular permanent magnetic. When a preset amplitude of acceleration is exceeded, a quasi digital switching behavior is achieved by a radially opening annular gap between the end face of the inertial body and the surface of the annular permanent magnet turned towards that face.

16 Claims, 1 Drawing Sheet

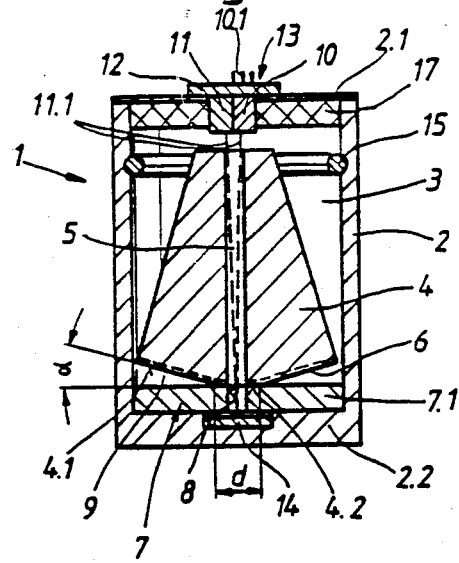
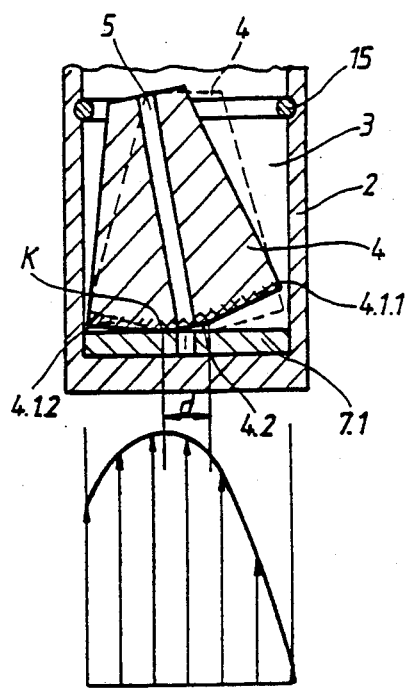
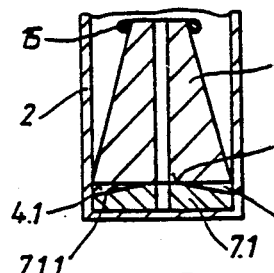
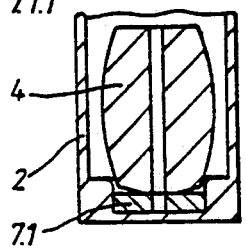
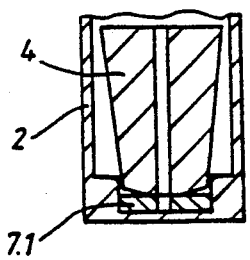
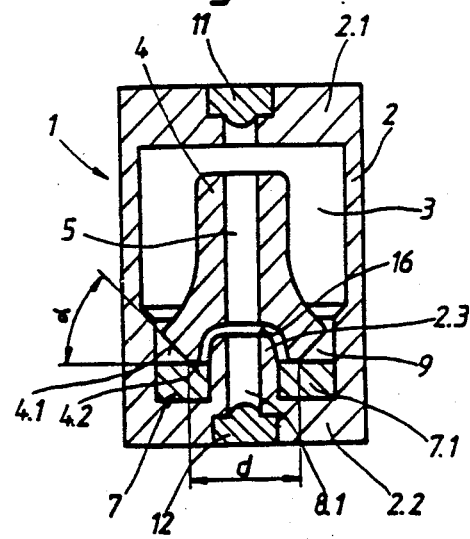

ACCELERATION SENSOR PICK-UP WITH MAGNETIC BASE STABILIZATION

BACKGROUND AND SUMMARY OF THE INVENTION

The invention relates to an acceleration pick-up for the automatic actuation of passenger safety devices in motor vehicles during emergency conditions leading up to an accident, comprising: a housing with an interior space with an elongated round and rotationally symmetric inertial body which functions as a seismic mass therein. A transmitter for transmitting signals to a receiver through a continuous longitudinal bore provided in the inertial body. The bore constitutes a signal path from the transmitter to the receiver when the inertial body is in a rest position. The inertial body has, at one end face, a supporting base by which the inertial body is supported on a bearing in the housing. The bearing also has a through bore which is aligned with the longitudinal bore of the inertial body, when the inertial body is in a normal rest position. When a preset amplitude of acceleration is exceeded, the inertial body is deflected along its supporting base so that the transmitter can no longer send a signal through the cooperating bores to the receiver. The interruption of this signal provides the acceleration pick-up.

German Offenlegungsschrift 3 540 948 shows a similar pick-up in FIG. 6. A comparable acceleration pick-up is also shown by WO 85/04627.

Moreover, an acceleration pick-up is known from German Pat. Nos. 3,313,033 and 3,402,387, in which an inertial body is held in a rest position by a permanent magnet.

Electrical switching systems having mechanical contact making are disadvantageous in that the contacts can become contaminated, can corrode, etc. during the lifetime of the system, so that it is no longer possible to guarantee the functioning of the switch in case of need.

Known systems having optoelectronic scanning are disadvantageous in that they have a quasi analogue switching behavior.

It is therefore the object of the invention to construct an acceleration pick-up such that it functions in an especially reliable fashion during its lifetime, and when subjected to an acceleration generates a quasi digital signal with a high slope rate.

This object is achieved by having an inertial body with soft magnetic properties, and with its supporting bearing constructed in the form of an permanent annular magnet, the diameter of which corresponds approximately to the diameter of a cooperating end face of the inertial body. The diameter of a portion of the supporting base bearing is smaller than the diameter of the end face, so as to define a radially opening annular slot, starting from a flat center diameter portion of the supporting base radially outward. In this construction, the center of the inertial body end face is flat, and rests on a flat bearing surface whereas, in the outer radial portions of the adjoining end face and bearing support, there is an annular gap through which the magnetic forces are felt.

It is also advantageous to have the inertial body be made from a non-magnetic material and provided with a soft magnetic lining on its end face.

It is desirable to have a flat control portion on the end face of the inertial body, which flares upward as it radiates from the center portion to define an annular gap. Alternatively, the inertial body could have a flat surface, and its supporting member could have a flat center portion and radial downwardly flaring portions extending from the center portion to define the annular gap.

An impact absorber can be provided on the inertial body itself, or on the housing, to both prevent rebounding of the inertial element and to limit the tilting of the inertial element.

The housing can be made of a non-metallic elastic material such as rubber or plastic.

The transmitter and the receiver can be located at the same side of the housing with the transmitter sending a signal along a bore in the inertial element which is reflected back to the receiver by a reflecting element at the other end of the housing. Alternatively, the reflecting element can be omitted when the receiver and transmitter are located at opposite ends of the housing.

Good results are obtained when the angle of the aperture gap is inversely proportional to the length of the inertial body and wherein the ratio of the diameter of the flat supporting base of the inertial body to the total diameter of the body is approximately 1:1.5 to 1:5.

Various shapes of the inertial body can be utilized such as a frustum, a double frustum, a barrel, etc. For centering purposes, a trough-shaped recess can be provided in the end face of the inertia element which cooperates with a cooperating projection in the support for the inertial member.

The electronics for the output pick-up can be provided by a circuit board plugged into, or attached to one end of the housing, or located internally thereof. The output could be directed to a power supply mechanism of the safety device actuator.

Other objects, advantages and novel features of the present invention will become apparent from the following detailed description of the invention when considered in conjunction with the accompanying drawings.

BRIEF DESCRIPTION OF THE DRAWINGS

FIG. 1 shows a schematic representation of an acceleration pick-up according to the invention;

FIG. 2 shows the acceleration pick-up according to FIG. 1 in a deflected position;

FIGS. 3, 4 and 5 show, in each case, a simplified representation of an alternative form of the acceleration pick-up; and FIG. 6 shows a schematic representation of a further illustrative embodiment of an acceleration pick-up according to the invention.

DETAILED DESCRIPTION OF THE DRAWINGS

The acceleration pick-up 1 has a hollow cylindrical housing 2, preferably of plastic or rubber, with an interior space 3, in which is disposed the inertial body 4 which functions as a seismic mass. The inertial body 4 is constructed in a rotationally symmetric fashion in the form of a double frustum. The body 4 is provided with a continuous longitudinal bore 5. The body 4 consists of soft magnetic material. However, for the purpose of sensing very small accelerations, the inertial body 4 can also consist of a non-magnetic material, such as plastic or aluminum provided, however, that at least on its end face 4.1 there is a soft magnetic lining 6, for example in the form of a film lamina or coating. Further, the inertial body 4 has, at its lower end face 4.1, a flat supporting base 4.2 with the diameter d, with which it is supported on a bearing 7. The bearing 7 extends perpendicular to the longitudinal bore 5 of body 4, and is constructed as an annular permanent magnet 7.1. The bearing also has a through bore 8 corresponding to the longitudinal bore 5 of the body 4. It is clear that the diameter d of the flat supporting base 4.2 is substantially smaller than the diameter of the end face 4.1. The end face 4.1 of the body 4 starts from the flat supporting base 4.2 in its center and angles upwardly at its edge portions to define, in conjunction with the flat annular permanent magnet 7.1, a radially opening annular slot 9 with the aperture angle $\alpha$.

FIG. 1 also shows the set up of the optoelectronic system. In line with the axis of the longitudinal bore 5 of the body are a transmitter 11 and a receiver 12, disposed as a reflection sensor 13 on a component 10. The component could, for example, be a semiconductor chip. The alignment of transmitter 11 and receiver 12 is such that in the rest position of the inertial body 4, a very sharply focused light ray 11.1, passes through the longitudinal bore 5 of the body and through bore 8 of the magnet 7.1, which bores are then aligned, and strike a reflection body 14, for example, a reflecting film, disposed beneath the annular permanent magnet 7.1 in the base of the housing 2.2, from whence it is reflected back to the receiver 12 from the reflection body 14.

An impact absorber 15 is disposed in the interior space of the housing 3 at the level of the end of the inertial body 4, taking the form, for example, of any of an O-ring, foam plastic ring or annular collar. As stated previously, the housing is elastically constructed. The function of the absorber, apart from preventing rebounding, is also to limit the tilt angle of the inertial body.

Because of the special shape of the end face 4.1 of the inertial body 4, which has soft magnetic properties, the annular permanent magnet 7.1 not only aligns the latter with a definite holding power, but also centers it along its axis of symmetry. Because of the relatively large surface area of the magnet and of its symmetrically extending field lines, wobbling or rotating of the inertial body during the process of tilting is prevented.

The use of the optoelectronic system 13, 14 offers the advantage of enabling a permanent monitoring of the acceleration pick-up during its lifetime.

If, when the acceleration pick-up is in use, a preset amplitude of acceleration in the x/y plane is exceeded, the relatively narrow longitudinal bore 5 ensures that for the slightest deflection of the inertial body 4 from the axis of symmetry, with the bore 8 leading to reflector 14, i.e., the optical axis, the transmission path from transmitter 11 to reflector 14 to receiver 12 is interrupted and therefore an actuation control signal is initiated. In this connection, the "snap effect", required for a quasi digital signal when the preset acceleration threshold value is exceeded, is likewise achieved by the special shape of the end face 4.1 of the inertial body 4 in conjunction with the annular permanent magnet 7.1. Namely, the invention exploits the physical principle, that magnetic attraction between two bodies decreases as the square of their separation (air gap).

As may be seen from FIG. 2, when the preset amplitude of acceleration is exceeded in any direction, the inertial body 4 tilts away from its rest position above a tilt point K lying on the diameter d of its supporting base 4.2 and the angled segment 4.1.1 of the flat end face 4.1 (cross-hatched) and lifts away from the permanent magnet 7.1. In cooperation with the radially opening annular slot 9, the quadratic dependency of magnetic attraction and air gap causes the magnetic attraction to decrease disproportionately at the angled segment 4.1.1 moving away from the magnet 7.1, but to become increasingly larger at the angled segment 4.1.2 (hatched) approaching the magnet, i.e., this latter angled segment 4.1.2 is attracted with increasing intensity. Consequently, once the inertial body 4 has moved away from its rest position, the magnet conditions which have been described, intensify and accelerate the tilting process, and a quasi digital switching behavior is achieved through a "snap effect".

An identical switching behavior is also achieved with the embodiment according to FIG. 3, in which, starting from the flat supporting base 4.2, the top face 7.1.1 of the annular permanent magnet 7.1 defines the radially opening slot 9 in conjunction with the flat end face 4.1 of the inertial body 4. This figure shows further that the impact absorber 15 may, alternatively, also be disposed on the inertial body 4 itself instead of on the housing.

FIG. 4 shows an embodiment utilizing a barrel-shaped inertial body 4. FIG. 5 shows a frustum-shaped inertial body 4. Thus, it is possible to choose the shape of the body 4 as a function of the position of the center of gravity of the inertial body and of the magnitude of the area of the supporting base, depending on the particular switching threshold and switching quality required.

Whereas in FIG. 1, the reflection sensor 13 is disposed in the upper housing face 2.1, and the reflection body 14 is disposed in the base of the housing 2.2, it is also possible to have a reversed set up. This alternative construction has the advantage that mounting of the acceleration pick-up 1 on a printed circuit board is simplified in that pointing contact pins 10.1 of the component 10 now will point downwardly and be able to serve at the same time to fix the entire acceleration pick-up pluggably to the printed circuit board. In principle, however, it is also possible to integrate the entire evaluation electronics 17, for example, a time element, a monoflop and electronic switches into the housing 2, thus producing a very compact design overall.

It is also possible to dispense with the reflection body 14 by disposing a transmitter 11 on one side, and a receiver 12 on the other side of the longitudinal bores 5 and in the housing 2, as shown in FIG. 6. In this FIG. 6 embodiment, the inertial body 4 has, at its lower end face 4.1 in the region of the longitudinal bore 5, a trough-shaped recess 16, into which projects a correspondingly shaped extension of the housing 2.3, which has a through bore 8.1 corresponding to the longitudinal bore 5, and on which the annular permanent magnet 7.1 is disposed. The inertial body 4 is supported on the annular permanent magnet 7.1 with a flat, circular annular supporting base 4.2 of diameter d, the end face 4.1 starts from the flat supporting base 4.2 in its center and angles upward at its edges to define a radially opening annular slot 9 of aperture angle $\alpha$ in conjunction with the flat annular permanent magnet 7.1.

The special cooperating construction of the inertial body 4 with a recess 16 and of the housing 2 with a housing extension 2.3 serves the aim of once again returning the inertial body to its exact rest position after it has been tilted, and, if necessary, of reliably preventing the inertial body from becoming jammed in the housing.

In general terms, it is possible through selection of the parameters of the initial body and/or annular permanent magnet, or for example, the magnitude of the aperture angle α, which is inversely proportional to the length of the inertial body, the magnitude of the diameter d of the supporting base, etc., to manipulate the response threshold, and especially the switching characteristic of the omnidirectionally responsive acceleration pick-up. However, it is advantageous to select the ratio of the diameter d of the supporting base 4.2 to the diameter of the end face 4.1 with a value of 1:1.5 to 1:5.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. Acceleration pick-up for the automatic actuation of passenger safety devices in motor vehicles during an accident, comprising:
   a housing with an interior space;
   an elongated round and rotationally symmetric inertial body in said housing which functions as a seismic mass;
   a transmitter means for sending signals to a receiver means;
   said body means having a continuous longitudinal bore providing a signal path from said transmitter to said receiver in a rest position of the inertial body means;
   said inertial body means having at an end face, a supporting base by which the body means is supported;
   bearing means extending perpendicular to the longitudinal bore of said body means and having a through bore therein which is aligned with longitudinal bore of the body means when the body means is in a normal rest position;
   the supporting base of the body means resting on the bearing means;
   wherein when a preset amplitude of acceleration is exceeded, the body means is deflected along its supporting base so that an actuation control signal is initiated owing to interruption of the transmission means sending a signal to the receiver means along said signal path;
   wherein the inertial body means has soft magnetic properties;
   the bearing is constructed in the form of an annular permanent magnet;
   the annular permanent magnet has a diameter that corresponds approximately to a diameter of the end face of the inertial body means;
   the supporting base having a diameter which is smaller than the diameter of the end face; and
   a radially opening annular gap being defined as the area starting from a center of the supporting base which abuts a flat surface on the annular permanent magnet to outwardly located spaces between the end face and the annular permanent magnet.

2. Acceleration pick-up according to claim 1, wherein the inertial body means consists of a non-magnetic material and is provided with a soft magnetic lining on at least its end face.

3. Acceleration pick-up according to claim 1, wherein the flat supporting base has a flat central portion and the end face of the inertial body means provides the radially opening annular gap in conjunction with the annular permanent magnet which itself is flat.

4. Acceleration pick-up according to claim 1, wherein, starting from the supporting base, the inertial body means is flat and a top face of the annular permanent magnet defines the radial annular gap.

5. Acceleration pick-up according to claim 1, wherein the inertial body means carries an impact absorber at its end located opposite its end face.

6. Acceleration pick-up according to claim 1, wherein an impact absorber is disposed in the interior space of the housing adjacent the end of the inertial body means opposite its end face.

7. Acceleration pick-up according to claim 1, wherein the housing consists of non-metallic elastic material.

8. Acceleration pick-up according to claim 1, wherein said transmitter and receiver are disposed opposite each other in the housing in line with the longitudinal bore.

9. Acceleration pick-up according to claim 1, wherein there is a reflector body means in line with the longitudinal bore at one end of the housing;
   the transmitter and receiver being located at an opposite end of the housing from the reflector means; and wherein the transmitter sends a signal through the bore to the reflector body means which reflects the signal back to the receiver.

10. Acceleration pick-up according to claim 1, wherein the ratio of the diameter of the supporting base to the diameter of the end face is approximately 1:1.5 to 15.

11. Acceleration pick-up according to claim 1, wherein the annular gap has an aperture angle α which is inversely proportional to the length of the inertial body.

12. Acceleration pick-up according to claim 1, wherein the inertial body has the shape of at least one of a frustum, double frustum and a barrel.

13. Acceleration pick-up according to claim 1, wherein at the lower end face, the inertial body means has a trough-shaped recess in the region of the longitudinal bore, into which projects a correspondingly shaped extension of the housing.

14. Acceleration pick-up according to claim 1, wherein evaluation electronics of the acceleration pick-up are integrated into the interior space of the housing.

15. Acceleration pick-up according to claim 1, wherein an acceleration output pick-up may be plugged into a printed circuit board.

16. Acceleration pick-up according to claim 1, wherein an acceleration output pick-up may be connected to a power supply of the safety device.

* * * * *